(12) United States Patent
Fong et al.

(10) Patent No.: US 9,085,821 B2
(45) Date of Patent: Jul. 21, 2015

(54) SPUTTER GUN HAVING VARIABLE MAGNETIC STRENGTH

(75) Inventors: Owen Ho Yin Fong, San Jose, CA (US); Kent Riley Child, Dublin, CA (US)

(73) Assignee: Intermolecular, Inc., San Jose, CA (US)

( * ) Notice: Subject to any disclaimer, the term of this patent is extended or adjusted under 35 U.S.C. 154(b) by 836 days.

(21) Appl. No.: 13/325,348

(22) Filed: Dec. 14, 2011

(65) Prior Publication Data

US 2013/0156936 A1 Jun. 20, 2013

(51) Int. Cl.
| | |
|---|---|
| C23C 14/34 | (2006.01) |
| C23C 14/35 | (2006.01) |
| C23C 14/04 | (2006.01) |
| C23C 14/50 | (2006.01) |
| C23C 14/54 | (2006.01) |
| C23C 14/56 | (2006.01) |
| H01J 37/34 | (2006.01) |

(52) U.S. Cl.
CPC .............. *C23C 14/35* (2013.01); *C23C 14/042* (2013.01); *C23C 14/351* (2013.01); *C23C 14/352* (2013.01); *C23C 14/505* (2013.01); *C23C 14/542* (2013.01); *C23C 14/564* (2013.01); *H01J 37/34* (2013.01); *H01J 37/3402* (2013.01)

(58) Field of Classification Search
CPC ... H01J 37/3435; H01J 37/3402; H01J 37/34; C23C 14/35; C23C 14/042; C23C 14/351; C23C 14/352; C23C 14/542; C23C 14/564; C23C 14/505
USPC ............... 204/298.19, 298.12, 298.2, 298.18, 204/298.16
See application file for complete search history.

(56) References Cited

U.S. PATENT DOCUMENTS

| | | |
|---|---|---|
| 4,219,397 A | 8/1980 | Clarke |
| 5,174,880 A | 12/1992 | Bourez et al. |
| 5,855,744 A | 1/1999 | Halsey et al. |
| 6,262,539 B1 * | 7/2001 | Shi et al. .................. 315/111.81 |
| 7,347,919 B2 | 3/2008 | Sato et al. |
| 7,674,360 B2 * | 3/2010 | Hong et al. ................ 204/298.2 |
| 2005/0133361 A1 | 6/2005 | Ding et al. |

* cited by examiner

*Primary Examiner* — John Brayton

(57) ABSTRACT

A sputter source is provided. The sputter source includes a shaft extending through a central region of the sputter source. A first end of the shaft is coupled to a drive and a second end of the shaft is coupled to a bottom plate. A first plate having a ramped surface is included where the first plate is stationary. A second plate having a ramped surface is provided where the second plate is disposed above the first plate such that portions of the ramped surfaces contact each other. The second plate is coupled to the shaft, wherein the second plate is operable to rotate and move axially as the shaft rotates in a first direction and wherein the second plate is operable to remain stationary as the shaft rotates in a second direction.

15 Claims, 7 Drawing Sheets

SPUTTER GUN HAVING VARIABLE MAGNETIC STRENGTH

BACKGROUND

Physical vapor deposition (PVD) is commonly used within the semiconductor industry, as well as within solar, glass coating, and other industries, in order to deposit a layer over a substrate. Sputtering is a common physical vapor deposition method, where atoms or molecules are ejected from a target material by high-energy particle bombardment and then deposited onto the substrate.

The targets employed for PVD processes erode over time. To ensure uniform layer thickness and characteristics, the magnetic field strength on the target should be constant over the entire target life. However, as substrates are sequentially processed using the same target, the surface of the target is eroded, thereby causing the target to become physically smaller. Thus, the magnetic strength on the target changes over the target life, resulting in varied layer properties among the sequentially processed substrates as the deposition rate tends to increase as the target becomes physically smaller and the magnetic strength changes.

What is needed is the ability to maintain a constant deposition rate over the lifetime of the target.

SUMMARY

Embodiments of the present invention provide a method and apparatus that maintains a substantially constant spatial relationship between the magnets of a process gun and the surface of a target over the lifetime of the target. Several inventive embodiments of the present invention are described below.

In one aspect of the invention, a sputter source is provided. The sputter source includes a shaft extending through a central region of the sputter source. A first end of the shaft is coupled to a drive and a second end of the shaft is coupled to a bottom plate. A first plate having a ramped surface is included where the first plate is stationary. A second plate having a ramped surface is provided where the second plate is disposed above the first plate such that portions of the ramped surfaces contact each other. The second plate is coupled to the shaft, wherein the second plate is operable to rotate and move axially as the shaft rotates in a first direction and wherein the second plate is operable to remain stationary as the shaft rotates in a second direction.

In another aspect of the invention a method of processing a substrate is provided. The method includes depositing a layer of material onto the substrate through a vapor deposition process. During the depositing, the method includes identifying a rate of erosion of a source of the layer of material and changing a direction of rotation of a shaft operable to rotate a plurality of magnets disposed above the source. The reversing causes axial movement of the plurality of magnets along an axis of the shaft.

Other aspects of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. Like reference numerals designate like structural elements.

DETAILED DESCRIPTION

Figure 1:
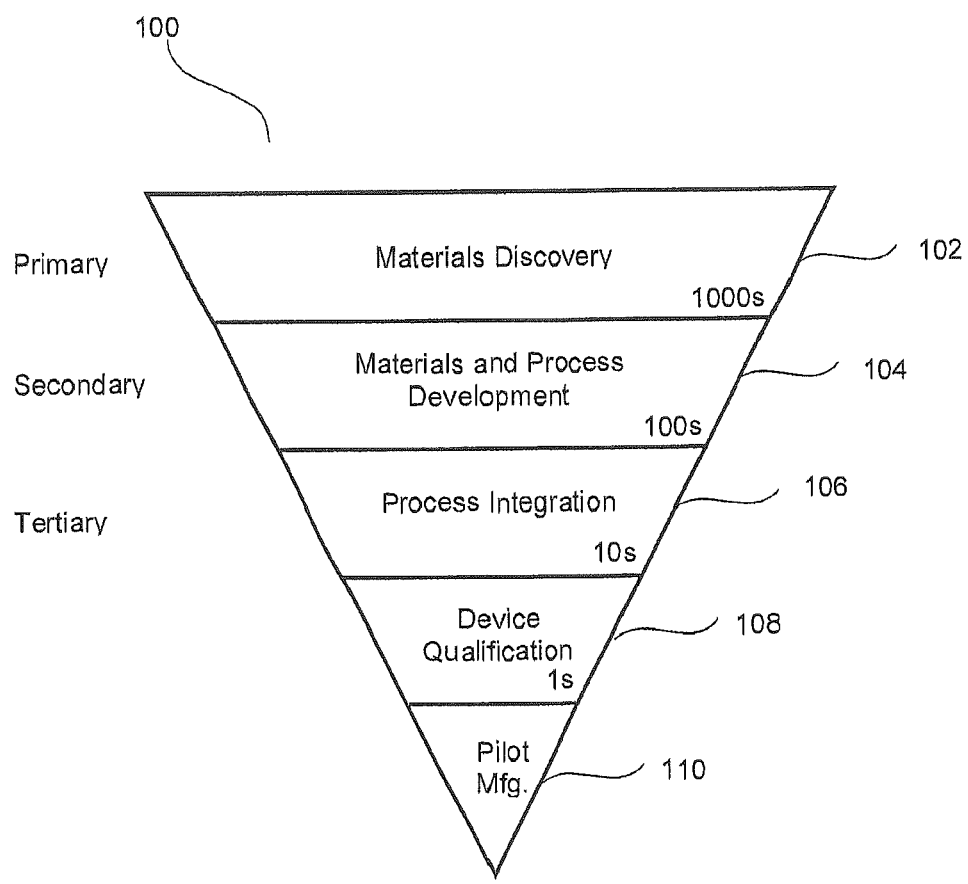
FIG. 1 illustrates a schematic diagram for implementing combinatorial processing and evaluation using primary, secondary, and tertiary screening.

The embodiments described herein provide a method and apparatus related to sputter deposition processing. It will be obvious, however, to one skilled in the art, that the present invention may be practiced without some or all of these specific details. In other instances, well known process operations have not been described in detail in order not to unnecessarily obscure the present invention.

Semiconductor manufacturing typically includes a series of processing steps such as cleaning, surface preparation, deposition, patterning, etching, thermal annealing, and other related unit processing steps. The precise sequencing and integration of the unit processing steps enables the formation of functional devices meeting desired performance metrics such as efficiency, power production, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as integrated circuits. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat.

No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

HPC processing techniques have been successfully adapted to wet chemical processing such as etching and cleaning. HPC processing techniques have also been successfully adapted to deposition processes such as physical vapor deposition (PVD), atomic layer deposition (ALD), and chemical vapor deposition (CVD).

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of semiconductor manufacturing operations by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating a device. A global optimum sequence order is therefore derived and as part of this derivation, the unit processes, unit process parameters and materials used in the unit process operations of the optimum sequence order are also considered.

The embodiments described further analyze a portion or sub-set of the overall process sequence used to manufacture a semiconductor device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate that are equivalent to the structures formed during actual production of the semiconductor device. For example, such structures may include, but would not be limited to, contact layers, buffer layers, absorber layers, or any other series of layers or unit processes that create an intermediate structure found on semiconductor devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
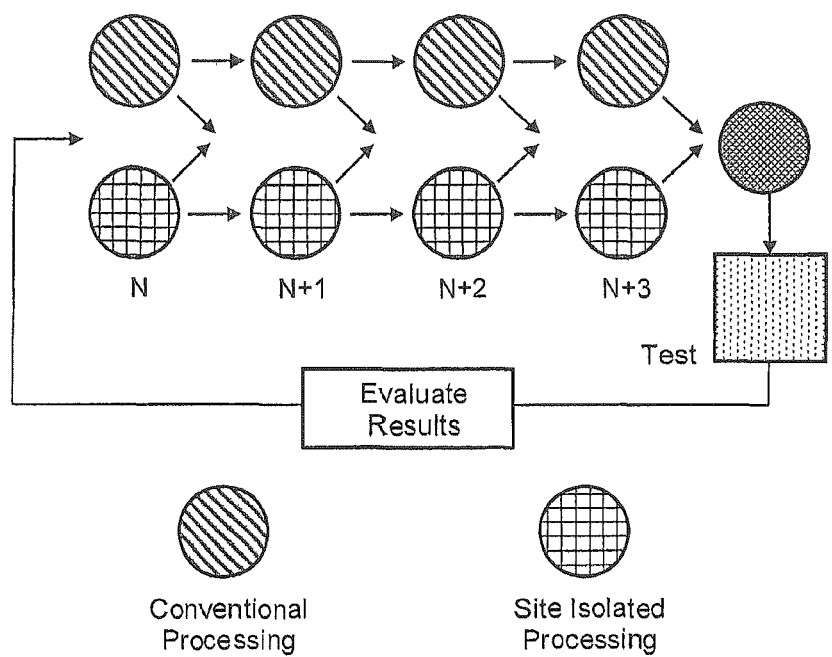
FIG. 2 is a simplified schematic diagram illustrating a general methodology for combinatorial process sequence integration that includes site isolated processing and/or conventional processing in accordance with one embodiment of the invention.

FIG. 2 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in semiconductor manufacturing may be varied.

As mentioned above, within a region, the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

Figure 3:
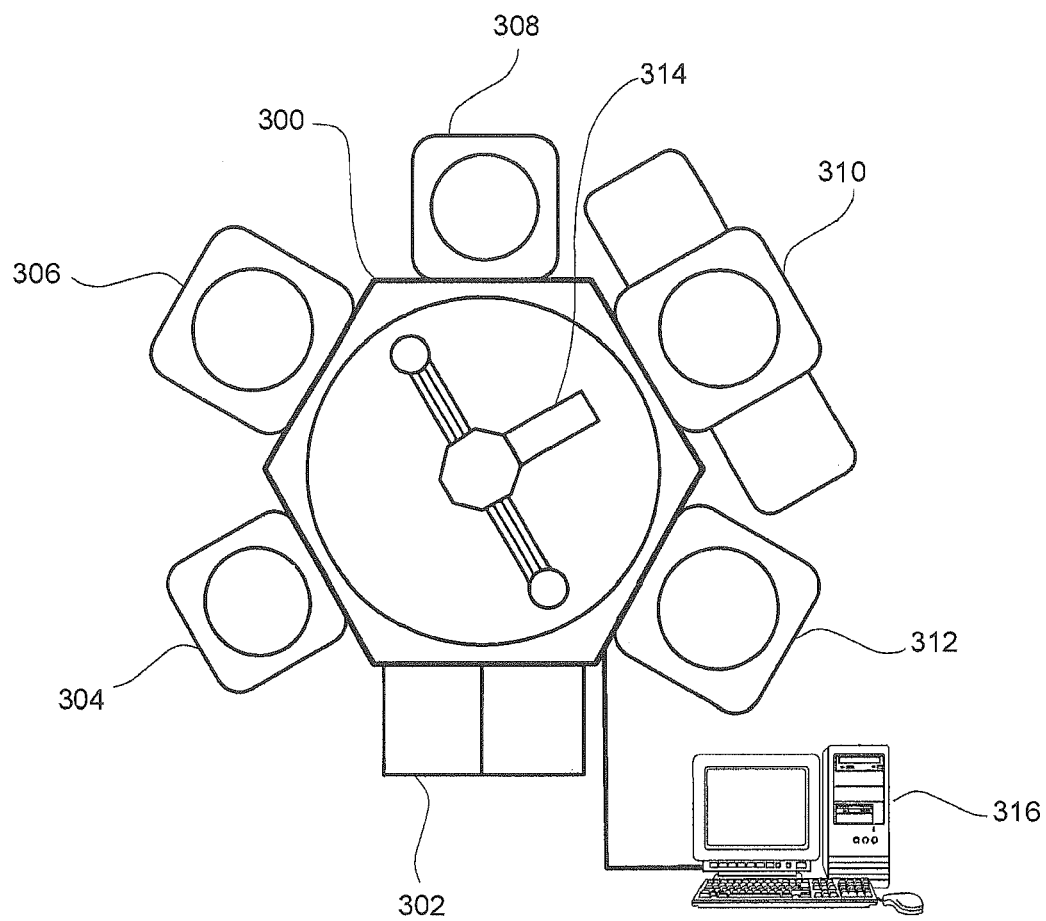
FIG. 3 is a simplified schematic diagram illustrating an integrated high productivity combinatorial (HPC) system in accordance with some embodiments of the invention.

FIG. 3 is a simplified schematic diagram illustrating an integrated high productivity combinatorial (HPC) system in accordance with some embodiments of the invention. HPC system includes a frame 300 supporting a plurality of processing modules. It should be appreciated that frame 300 may be a unitary frame in accordance with some embodiments. In some embodiments, the environment within frame 300 is controlled. Load lock/factory interface 302 provides access into the plurality of modules of the HPC system. Robot 314 provides for the movement of substrates (and masks) between the modules and for the movement into and out of the load lock 302. Modules 304-312 may be any set of modules and preferably include one or more combinatorial modules. For example, module 304 may be an orientation/degassing module, module 306 may be a clean module, either plasma or non-plasma based, modules 308 and/or 310 may be combinatorial/conventional dual purpose modules. Module 312 may provide conventional clean or degas as necessary for the experiment design.

Any type of chamber or combination of chambers may be implemented and the description herein is merely illustrative of one possible combination and not meant to limit the potential chamber or processes that can be supported to combine combinatorial processing or combinatorial plus conventional processing of a substrate or wafer. In some embodiments, a centralized controller, i.e., computing device 316, may control the processes of the HPC system, including the power supplies and synchronization of the duty cycles described in more detail below. Further details of one possible HPC system are described in U.S. application Ser. Nos. 11/672,478 and 11/672,473. With HPC system, a plurality of methods may be employed to deposit material upon a substrate employing combinatorial processes.

Figure 4:
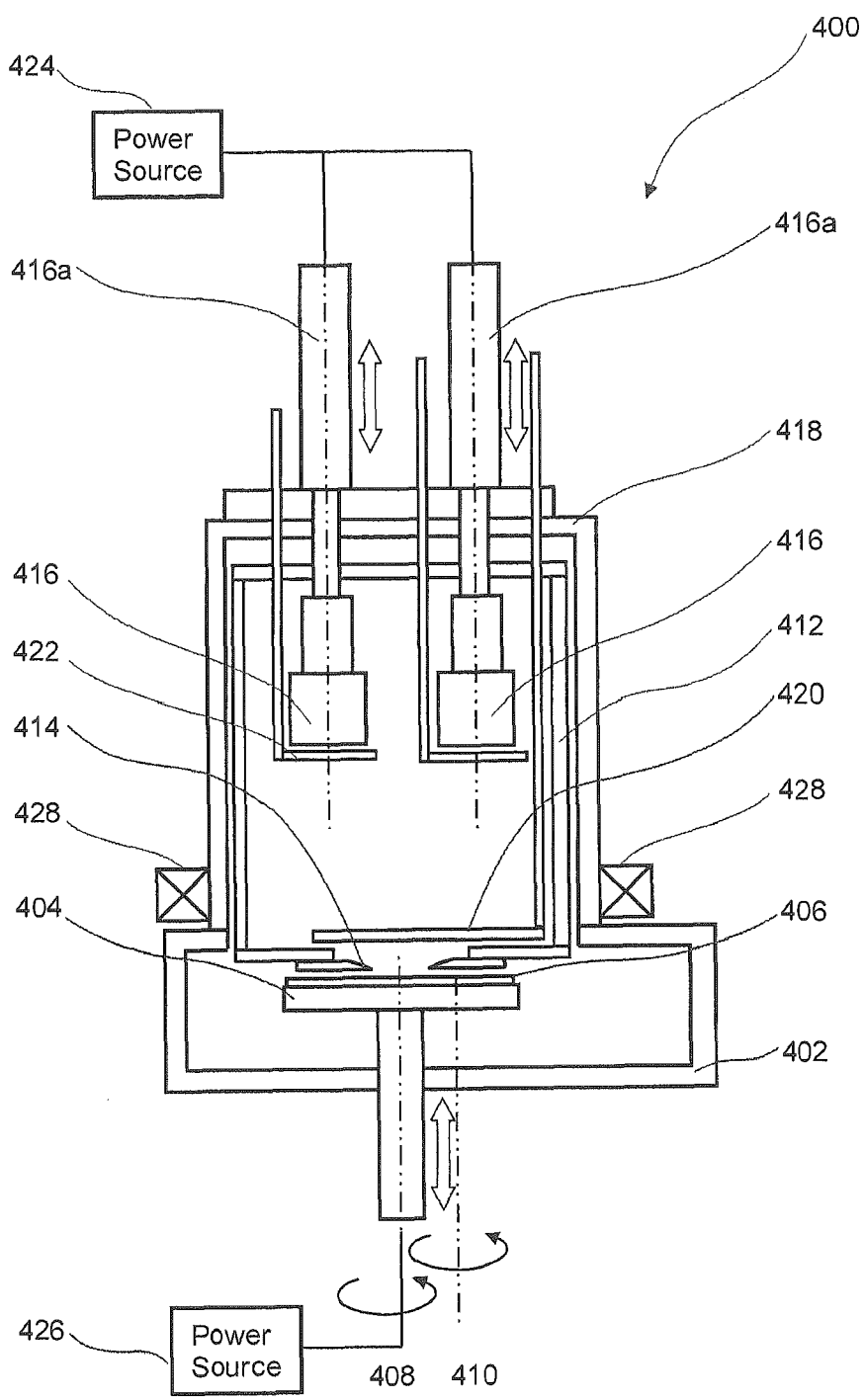
FIG. 4 is a simplified schematic diagram illustrating a sputter processing chamber configured to perform combinatorial processing and full substrate processing in accordance with some embodiments of the invention.

FIG. 4 is a simplified schematic diagram illustrating a sputter chamber configured to perform combinatorial processing and full substrate processing in accordance with some embodiments of the invention. Processing chamber 400 includes a bottom chamber portion 402 disposed under top chamber portion 418. Within bottom portion 402, substrate support 404 is configured to hold a substrate 406 disposed thereon and can be any known substrate support, including but not limited to a vacuum chuck, electrostatic chuck or other known mechanisms. Substrate support 404 is capable of both rotating around its own central axis 408 (referred to as "rotation" axis), and rotating around an exterior axis 410 (referred to as "revolution" axis). Such dual rotary substrate support is central to combinatorial processing using site-isolated mechanisms. Other substrate supports, such as an XY table, can also be used for site-isolated deposition. In addition, substrate support 404 may move in a vertical direction. It should be appreciated that the rotation and movement in the vertical direction may be achieved through known drive mechanisms which include magnetic drives, linear drives, worm screws, lead screws, a differentially pumped rotary feed through drive, etc. Power source 426 provides a bias power to substrate support 404 and substrate 406, and produces a negative bias voltage on substrate 406. In some embodiments power source 426 provides a radio frequency (RF) power sufficient to take advantage of the high metal ionization to improve step coverage of vias and trenches of patterned wafers. In another embodiment, the RF power supplied by power source 426 is pulsed and synchronized with the pulsed power from power source 424. Further details of the power sources and their operation may be found in U.S. patent application Ser. No. 13/281,316 entitled "High Metal Ionization Sputter Gun" filed on Oct. 25, 2011 and is herein incorporated by reference.

Substrate 406 may be a conventional round 200 mm, 300 mm, or any other larger or smaller substrate/wafer size. In other embodiments, substrate 406 may be a square, rectangular, or other shaped substrate. One skilled in the art will appreciate that substrate 406 may be a blanket substrate, a coupon (e.g., partial wafer), or even a patterned substrate having predefined regions. In another embodiment, substrate 406 may have regions defined through the processing described herein. The term region is used herein to refer to a localized area on a substrate which is, was, or is intended to be used for processing or formation of a selected material. The region can include one region and/or a series of regular or periodic regions predefined on the substrate. The region may have any convenient shape, e.g., circular, rectangular, elliptical, wedge-shaped, etc. In the semiconductor field a region may be, for example, a test structure, single die, multiple dies, portion of a die, other defined portion of substrate, or an undefined area of a substrate, e.g., blanket substrate which is defined through the processing.

Top chamber portion 418 of chamber 400 in FIG. 4 includes process kit shield 412, which defines a confinement region over a radial portion of substrate 406. Process kit shield 412 is a sleeve having a base (optionally integrated with the shield) and an optional top within chamber 400 that may be used to confine a plasma generated therein. The generated plasma will dislodge atoms from a target and the sputtered atoms will deposit on an exposed surface of substrate 406 to combinatorial process regions of the substrate in some embodiments. In another embodiment, full wafer processing can be achieved by optimizing gun tilt angle and target-to-substrate spacing, and by using multiple process guns 416. Process kit shield 412 is capable of being moved in and out of chamber 400, i.e., the process kit shield is a replaceable insert. In another embodiment, process kit shield 412 remains in the chamber for both the full substrate and combinatorial processing. Process kit shield 412 includes an optional top portion, sidewalls and a base. In some embodiments, process kit shield 412 is configured in a cylindrical shape, however, the process kit shield may be any suitable shape and is not limited to a cylindrical shape.

The base of process kit shield 412 includes an aperture 414 through which a surface of substrate 406 is exposed for deposition or some other suitable semiconductor processing operations. Aperture shutter 420 which is moveably disposed over the base of process kit shield 412. Aperture shutter 420 may slide across a bottom surface of the base of process kit shield 412 in order to cover or expose aperture 414 in some embodiments. In another embodiment, aperture shutter 420 is controlled through an arm extension which moves the aperture shutter to expose or cover aperture 414. It should be noted that although a single aperture is illustrated, multiple apertures may be included. Each aperture may be associated with a dedicated aperture shutter or an aperture shutter can be configured to cover more than one aperture simultaneously or separately. Alternatively, aperture 414 may be a larger opening and plate 420 may extend with that opening to either completely cover the aperture or place one or more fixed apertures within that opening for processing the defined regions. The dual rotary substrate support 404 is central to the site-isolated mechanism, and allows any location of the substrate or wafer to be placed under the aperture 414. Hence, the site-isolated deposition is possible at any location on the wafer/substrate.

A gun shutter, 422 may be included. Gun shutter 422 functions to seal off a deposition gun when the deposition gun may not be used for the processing in some embodiments. For example, two process guns 416 are illustrated in FIG. 4. Process guns 416 are moveable in a vertical direction so that one or both of the guns may be lifted from the slots of the shield. While two process guns are illustrated, any number of process guns may be included, e.g., one, three, four or more process guns may be included. Where more than one process gun is included, the plurality of process guns may be referred to as a cluster of process guns. Gun shutter 422 can be transitioned to isolate the lifted process guns from the processing area defined within process kit shield 412. In this manner, the process guns are isolated from certain processes when desired. It should be appreciated that slide cover plate 422 may be integrated with the top of the process kit shield 412 to cover the opening as the process gun is lifted or individual cover plate 422 can be used for each target. In some embodiments, process guns 416 are oriented or angled so that a normal reference line extending from a planar surface of the target of the process gun is directed toward an outer periphery of the substrate in order to achieve good uniformity for full substrate deposition film. The target/gun tilt angle depends on the target size, target-to-substrate spacing, target material, process power/pressure, etc.

Top chamber portion 418 of chamber 400 of FIG. 4 includes sidewalls and a top plate which house process kit shield 412. Arm extensions 416a, which are fixed to process guns 416 may be attached to a suitable drive, e.g., lead screw, worm gear, etc., configured to vertically move process guns 416 toward or away from a top plate of top chamber portion 418. Arm extensions 416a may be pivotally affixed to process guns 416 to enable the process guns to tilt relative to a vertical axis. In some embodiments, process guns 416 tilt toward aperture 414 when performing combinatorial processing and tilt toward a periphery of the substrate being processed when performing full substrate processing. It should be appreciated that process guns 416 may tilt away from aperture 414 when performing combinatorial processing in another embodiment. In yet another embodiment, arm extensions 416a are attached to a bellows that allows for the vertical movement and tilting of process guns 416. Arm extensions 416a enable movement with four degrees of freedom in some embodiments. Where process kit shield 412 is utilized, the aperture openings are configured to accommodate the tilting of the process guns. The amount of tilting of the process guns may be dependent on the process being performed in some embodiments.

Power source 424 provides power for sputter guns 416 whereas power source 426 provides RF bias power to an electrostatic chuck to bias the substrate when necessary. It should be appreciated that power source 424 may output a direct current (DC) power supply or a radio frequency (RF) power supply.

Chamber 400 includes auxiliary magnet 428 disposed around an external periphery of the chamber. The auxiliary magnet 428 is located in a region defined between the bottom surface of sputter guns 416 and a top surface of substrate 406. Magnet 428 may be either a permanent magnet or an electromagnet. It should be appreciated that magnet 428 is utilized to provide more uniform bombardment of Argon ions and electrons to the substrate in some embodiments. In addition, auxiliary magnet may be disposed proximate to substrate support 404.

Figure 5:
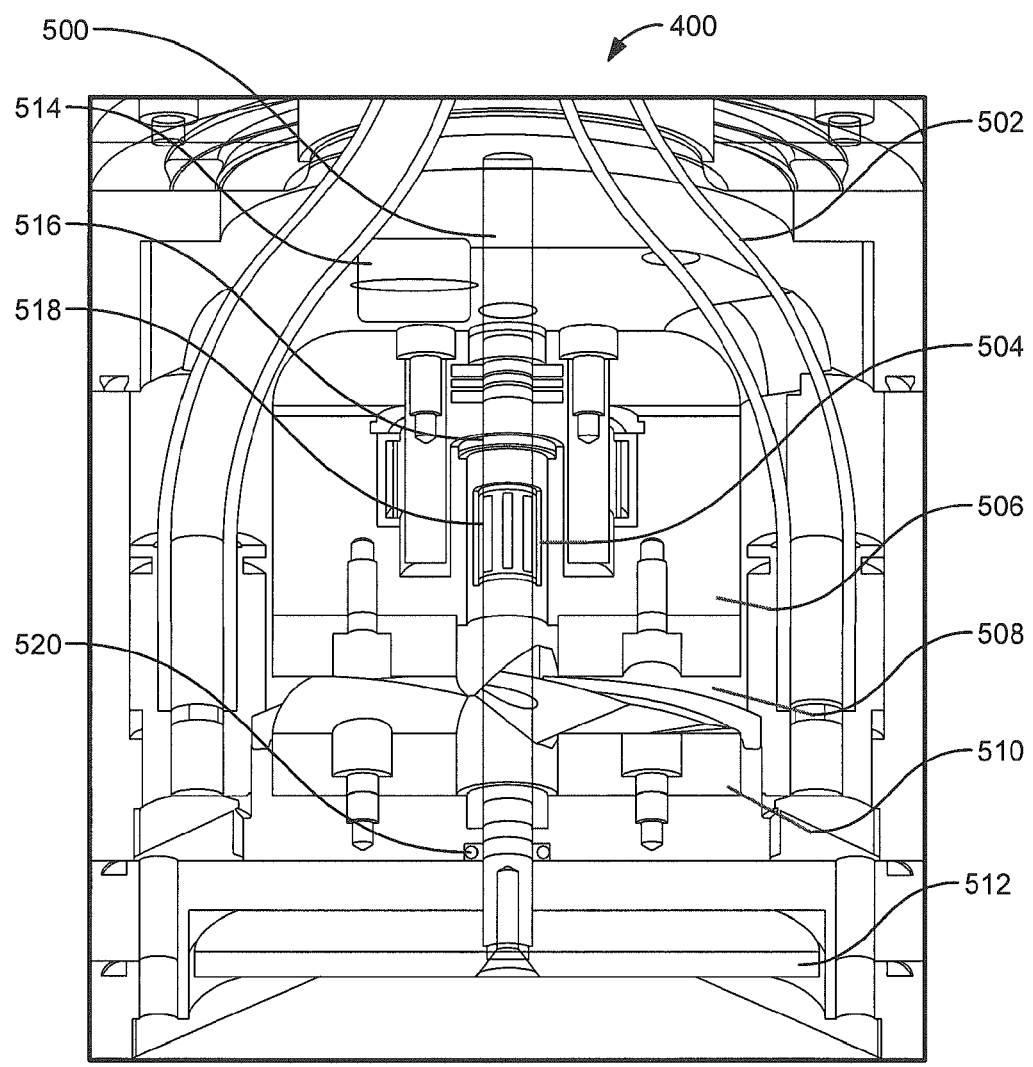
FIG. 5 is a simplified schematic diagram illustrating further details of a process gun in accordance with one embodiment of the invention.

FIG. 5 is a simplified schematic diagram illustrating further details of a process gun in accordance with one embodiment of the invention. Process gun 416 includes a centrally located shaft 500 extending through the process gun. Cooling water or any suitable cooling fluid is supplied to process gun 416 through lines 502. Housing 506 is coupled to shaft 500 by one way bearing 504. It should be appreciated that alternative couplings may be utilized in place of one way bearing 504. For example, a ratchet may be used in one embodiment. In some embodiments any coupling that enables rotation of shaft 500 to engage housing 506 in one direction of rotation and to disengage housing 506 in another direction of rotation may be integrated with the embodiments described herein. Coupled to housing 506 is rotating plate 508. Rotating plate 508 is disposed over stationary plate 510. Shaft 500 extends through an aperture within rotating plate 508 and an aperture within stationary plate 510. One end of shaft 500 is coupled to bottom plate 512, while another end is coupled to a drive mechanism, such as a motor. It should be appreciated that on an opposing surface of bottom plate 512, a plurality of magnets may be mounted thereon. Exemplary magnet distribution on bottom plate 512 is illustrated in U.S. application Ser. No. 13/281,316 entitled "High Metal Ionization Sputter Gun" filed on Oct. 25, 2011, which is herein incorporated by reference.

Spring 516 provides a downward force to housing 506 that results in a constant pressure being applied to the bottom surface of rotating plate 508 against a top surface of stationary plate 510. As described with reference to FIG. 7, the opposing surfaces of rotating plate 508 and stationary plate 510 are non-flat so that movement of one plate against another triggers axial movement along an axis of shaft 500. A second one way bearing 518 is coupled to housing 506 and functions to prevent the housing from back driving due to the weight of housing 506 and rotating plate 508 on the sloped surface of stationary plate 510. Sensor 514 functions to detect a surface of housing 506 in order to determine an amount of axial movement of the magnets affixed to bottom plate 512. In one embodiment, sensor 514 communicates with computing device 316 of FIG. 3. It should be appreciated that sensor 514 may utilize any commercially available sensing technology such as infrared, etc. Computing device 316 of FIG. 3 may store a lookup table that provides data with respect to the target source being utilized by process gun 416. In some embodiments, there may be a plurality of lookup tables associated with a corresponding target type. The data supplied for these lookup tables may be derived from empirical calculation based on the target material or actual measurements performed experimentally and recorded in a database. In alternative embodiments, the axial movement provided by the embodiments described herein may be based on time, such as the life time use of the target.

Still referring to FIG. 5, the axial movement of shaft 500 is achieved by the direction of rotation of the shaft. For example, shaft 500 may rotate in a first direction (clockwise) where only bottom plate 512 and magnets affixed thereto are rotating. Once shaft 500 reverses the direction of rotation (counter clockwise), one-way bearing 504 engages with housing 506, which is coupled to rotating plate 508, so that both the housing and the rotating plate begin to rotate. Once bearing 504 engages to trigger rotation of the rotating plate 508, the opposing ramped surfaces of rotating plate 508 and stationary plate 510 cause axial movement of bottom plate 512 in a direction toward a bottom surface of the stationary plate. Rotary seal 520 is provided to enable axial movement of shaft 500 through the assembly supporting stationary ramp 510 while isolating the cooling fluid from seeping through. Through this embodiment, as a target affixed to a bottom surface of process gun 416 erodes, the magnets affixed to a bottom surface of bottom plate 512 back away from the target in order to maintain a constant magnetic field strength asserted onto the target. Consequently, the deposition rate remains relatively constant as the target erodes during the processing. It should be appreciated that the embodiments to axially move the magnets as well as rotate the magnets is achieved through a single motor coupled to shaft 500, as the direction of rotation is utilized to engage or trigger the axial movement through a one way bearing and the rotating in stationary plates.

Figure 6:
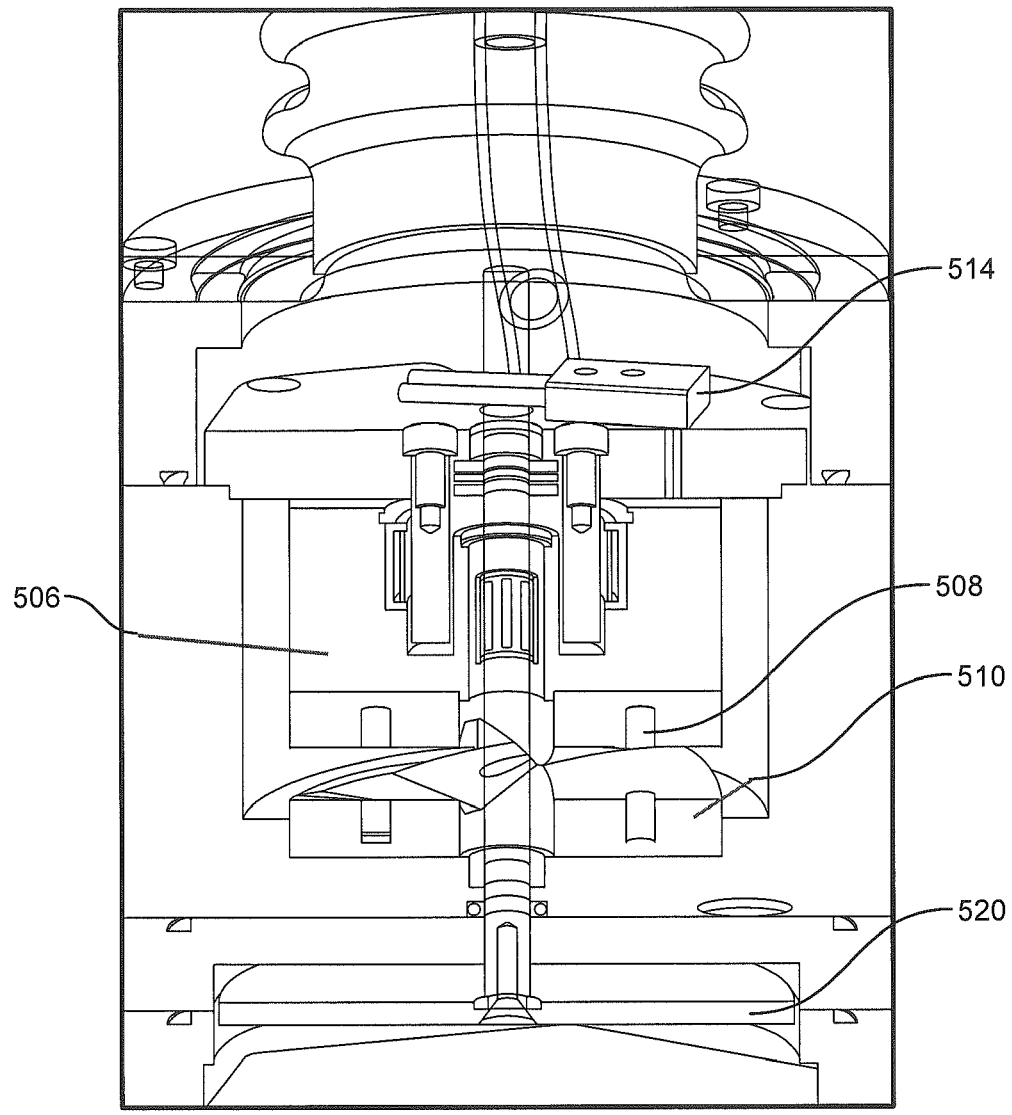
FIG. 6 is a simplified schematic diagram illustrating an alternative view of the process gun in accordance with one embodiment of the invention.

FIG. 6 is a simplified schematic diagram illustrating an alternative view of the process gun in accordance with one embodiment of the invention. Process gun 416 is illustrated with central shaft 500 extending through the process gun. Housing 506 is coupled to shaft 500 through one-way bearing 504. Rotating plate 508 is affixed to a bottom surface of housing 506. Stationary plate 510 is disposed under a surface of rotating plate 508. Rotary seal 520 enables axial movement through the support assembly for stationary plate 510 of process gun 416. Sensor 514 is configured to sense a surface of housing 506 in order to generate signals which can be processed through a computing device to determine an amount of axial movement of any magnets affixed to bottom plate 512.

Figure 7:
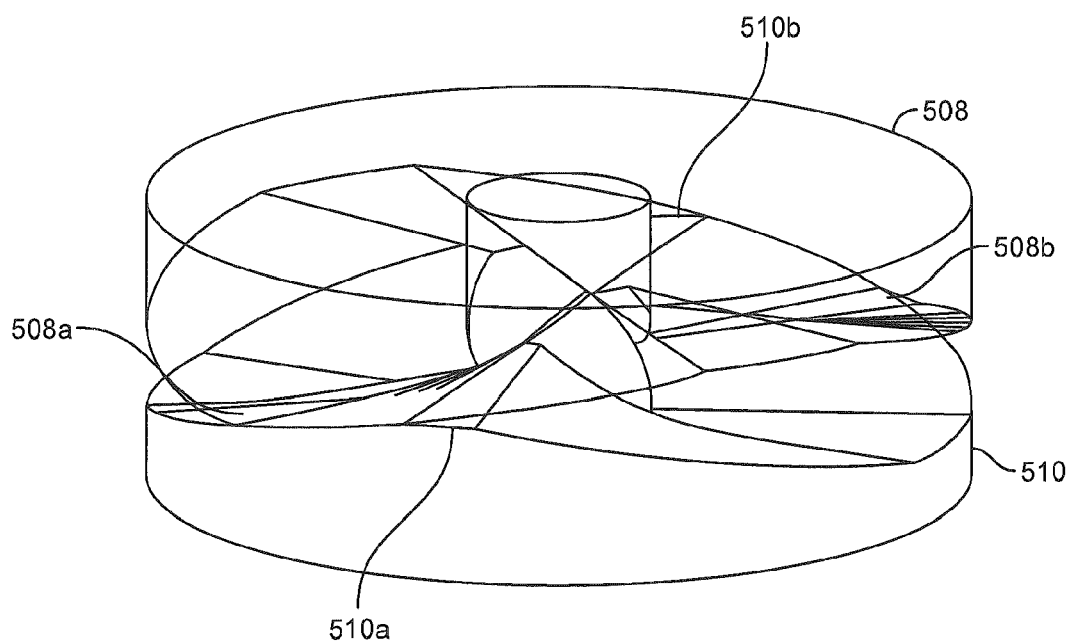
FIG. 7 is a simplified schematic diagram illustrating details of the rotatable plate and the stationary plate in accordance with one embodiment of the invention.

FIG. 7 is a simplified schematic diagram illustrating details of the rotatable plate and the stationary plate in accordance with one embodiment of the invention. Rotatable plate 508 is disposed over stationary plate 510. It should be appreciated that a bottom surface of rotatable plate 508 is ramped or sloped. In some embodiments, the opposing surfaces are configured contact each other across two radial support points. Since each of the opposing surfaces of rotating plate 508 and stationary plate 510 are sloped the axial movement of shaft 504 is triggered upon movement or rotation of the rotating plate and the amount of axial movement is dependent upon the angle of the slope and the amount of rotation. It should be appreciated that in one embodiment stationary plate 510 is composed of an insulative material as the surfaces which contact plate 510 may be electrically "hot." In one embodiment both or at least one of the opposing surfaces of rotating plate 508 and stationary plate 510 are coated with a component that is non-shedding and has a low coefficient of friction. For example, the opposing surfaces may be coated with a flouropolymer or some other suitable material compatible with the process conditions.

The exemplary illustration of the surfaces of plates 508 and 510 depicts sloped surfaces extending from a low point to a peak, where each of the surfaces includes one or more low points and one or more peaks. Each of the peaks and low points are defined by relatively flat surfaces so that. Radially flat extensions 510a and 510b are illustrated as the peaks for stationary plate 510, while radially flat extensions 508a and 508b are illustrated as the peaks for stationary plate 508. In some embodiments, the amount of axial travel the shaft may be displaced is about a ¼ inch. While the sloped surfaces are illustrated in FIG. 7, this is meant to be exemplary and not limiting.

From the above description it should be appreciated that the embodiments provide for adjustment in between processing regions or during processing. In some embodiments the shaft is rotated in a first direction as the processing, i.e., the deposition is occurring. Upon a triggering event, such as time or another monitored variable, the shaft rotation is reversed in order to engage the housing and coupled rotatable plate. The reversal can occur during the processing or at a pause in the processing, e.g., between combinatorial regions. The triggering of the reverse direction results in axial movement of the shaft due to the configuration of the surfaces of the rotatable plate and the stationary plate. Once the amount of travel in the reverse direction is completed, which may be a relatively small amount of travel, the direction of rotations of the shaft is reversed once again to return to the first direction of rotation. It should be appreciated that in either direction of rotation the magnets couple to the bottom plate will rotate. One skilled in the art will appreciate that the embodiments may be extended to any system where there is a need to move a component away from or towards another component.

The present invention provides greatly improved methods and apparatus for the combinatorial processing of different regions on a single substrate and processing of full substrate. The control for the axial movement of the shaft can be applied between combinatorial regions, i.e., when switching to process different regions, or the control can be timed, e.g., when performing full wafer processing. It is to be understood that the above description is intended to be illustrative and not restrictive. Many embodiments and variations of the invention will become apparent to those of skill in the art upon review of this disclosure. Merely by way of example a wide variety of process times, process temperatures and other process conditions may be utilized, as well as a different ordering of certain processing steps. The scope of the invention should, therefore, be determined not with reference to the above description, but instead should be determined with reference to the appended claims along with the full scope of equivalents to which such claims are entitled.

The embodiments described above provide methods and apparatus for the parallel or rapid serial synthesis, processing and analysis of novel materials having useful properties identified for semiconductor manufacturing processes. Any materials found to possess useful properties can then subsequently be prepared on a larger scale and evaluated in actual processing conditions. These materials can be evaluated along with reaction or processing parameters through the methods described above. In turn, the feedback from the varying of the parameters provides for process optimization. Some reaction parameters which can be varied include, but are not limited to, process material amounts, reactant species, processing temperatures, processing times, processing pressures, processing gas flow rates, processing powers, processing reagent compositions, the rates at which the reactions are quenched, atmospheres in which the processes are conducted, an order in which materials are deposited, etc. In addition, the methods described above enable the processing and testing of more than one material, more than one processing condition, more than one sequence of processing conditions, more than one process sequence integration flow, and combinations thereof, on a single substrate without the need of consuming multiple substrates per material, processing condition, sequence of operations and processes or any of the combinations thereof. This greatly improves the speed as well as reduces the costs associated with the discovery and optimization of semiconductor and other manufacturing operations.

Moreover, the embodiments described herein are directed towards delivering precise amounts of material under precise processing conditions at specific locations of a substrate in order to simulate conventional manufacturing processing operations. As mentioned above, within a region the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes and process sequences may vary. It should be noted that the discrete steps of uniform processing is enabled through the HPC systems described herein.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A sputter source, comprising:
 a shaft extending through a central region of the sputter source, a first end of the shaft coupled to a drive and a second end of the shaft coupled to a bottom plate;
 a first plate disposed such that the shaft extends through the first plate and remains stationary relative to the shaft when the shaft is rotated, wherein the first plate has an inclined surface;
 a second plate disposed such that the shaft extends through the second plate, wherein the second plate has an inclined surface, and wherein portions of the inclined surface of the first plate and portions of the inclined surface of the second plate contact each other; and
 wherein the second plate is coupled to the shaft such that rotation of the shaft in a first direction causes rotation of the second plate relative to the first plate and such that the second plate remains stationary relative to the shaft and the first plate during rotation of the shaft in a second direction.

2. The sputter source of claim 1, wherein rotation of the shaft in the first direction causes the second plate to move vertically relative to the first plate.

3. The sputter source of claim 1, wherein the second plate is coupled to the shaft through a one way bearing.

4. The sputter source of claim 1, wherein the second plate is coupled to the shaft through a ratchet.

5. The sputter source of claim 1, wherein the second plate is coupled to a housing and the housing is coupled to the shaft through a one way bearing.

6. The sputter source of claim 5, further comprising:
a sensor operable to sense a distance from the sensor to the housing, wherein a change of the distance from the sensor to the housing triggers rotation of the shaft in the first direction.

7. The sputter source of claim 1, wherein a plurality of magnets are coupled to a bottom surface of the first plate.

8. The sputter source of claim 1, wherein a gap lies between a portion of the inclined surface of the first plate and a portion of the inclined surface of the second plate.

9. A sputter source, comprising:
a shaft extending through a central region of the sputter source, the shaft having an axis, a first end of the shaft coupled to a drive, and a second end;
a bottom plate coupled to the second end of the shaft such that rotation of the shaft causes rotation of the bottom plate, wherein the bottom plate comprises a plurality of magnets attached thereto;
a stationary plate disposed between the first end of the shaft and the second end of the shaft such that the shaft extends through the stationary plate and the stationary plate remains stationary relative to the shaft when the shaft is rotated, wherein the stationary plate has an inclined surface;
a rotatable plate disposed between the first end of the shaft and the second end of the shaft such that the shaft extends through the rotatable plate, wherein the rotatable plate has an inclined surface, and wherein portions of the inclined surface of the stationary plate and portions of the inclined surface of the rotatable plate contact each other,
wherein the rotatable plate is coupled to the shaft such that rotation of the shaft in a first direction causes rotation of the rotatable plate relative to the stationary plate and such that the rotatable plate remains stationary relative to the shaft and the stationary plate during rotation of the shaft in a second direction.

10. The sputter source of claim 9, wherein rotation of the shaft in the first direction causes the rotatable plate to move vertically relative to the stationary plate.

11. The sputter source of claim 10, wherein a spring forces the rotatable plate against the stationary plate.

12. The sputter source of claim 10, wherein the rotatable plate contacts the stationary plate along at least one radial support point, and wherein a gap lies between a portion of the inclined surface of the stationary plate and a portion of the inclined surface of the rotatable plate.

13. The sputter source of claim 10, wherein the rotatable plate is coupled to a housing and the housing is coupled to the shaft through a first one way bearing, and wherein the housing includes a second one way bearing operable to prevent the housing from backdriving.

14. The sputter source of claim 9, further comprising:
a target affixed to a backing plate disposed below the plurality of magnets.

15. The sputter source of claim 10, further comprising:
a sensor operable to sense a distance from the sensor to a surface of a housing coupling the rotatable plate to the shaft.

* * * * *